United States Patent
Wei et al.

(10) Patent No.: US 9,105,484 B2
(45) Date of Patent: *Aug. 11, 2015

(54) EPITAXIAL STUCTURE

(71) Applicants: Tsinghua University, Beijing (CN); HON HAI PRECISION INDUSTRY CO., LTD., New Taipei (TW)

(72) Inventors: Yang Wei, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 169 days.

This patent is subject to a terminal disclaimer.

(21) Appl. No.: 13/713,512

(22) Filed: Dec. 13, 2012

(65) Prior Publication Data
US 2013/0285213 A1    Oct. 31, 2013

(30) Foreign Application Priority Data

Apr. 25, 2012 (CN) .......................... 2012 1 0122568

(51) Int. Cl.
*H01L 29/201* (2006.01)
*H01L 33/00* (2010.01)
*H01L 29/06* (2006.01)
*H01L 29/16* (2006.01)
*H01L 21/02* (2006.01)
*H01L 29/778* (2006.01)

(52) U.S. Cl.
CPC ............ *H01L 29/06* (2013.01); *H01L 21/0237* (2013.01); *H01L 21/0243* (2013.01); *H01L 21/0254* (2013.01); *H01L 21/02444* (2013.01); *H01L 21/02513* (2013.01); *H01L 21/02521* (2013.01); *H01L 29/1606* (2013.01); *H01L 29/7781* (2013.01)

(58) Field of Classification Search
None
See application file for complete search history.

(56) References Cited

U.S. PATENT DOCUMENTS

2007/0157873 A1*  7/2007  Hauptmann et al. ............ 117/87

FOREIGN PATENT DOCUMENTS

JP    2012-144415    8/2012

* cited by examiner

*Primary Examiner* — Evan Pert
*Assistant Examiner* — Shaka White
(74) *Attorney, Agent, or Firm* — Novak Druce Connolly Bove + Quigg LLP

(57) ABSTRACT

An epitaxial structure includes a patterned epitaxial growth surface defining a plurality of grooves. A graphene layer covers the patterned epitaxial growth surface. An epitaxial layer is formed on the patterned epitaxial growth surface, wherein a first part of the graphene layer is sandwiched between the substrate, and a second part of the graphene layer is embedded into the epitaxial layer.

19 Claims, 19 Drawing Sheets

EPITAXIAL STUCTURE

CROSS-REFERENCE TO RELATED APPLICATIONS

This application claims all benefits accruing under 35 U.S.C. §119 from China Patent Application: Application No. 201210122568.1, filed on Apr. 25, 2012 in the China Intellectual Property Office, disclosure of which are incorporated herein by reference.

BACKGROUND

1. Technical Field

The present disclosure relates to an epitaxial structure, a method for making the same and the application thereof.

2. Description of Related Art

Light emitting devices such as light emitting diodes (LEDs) applied on substrates made of group III-V nitride semiconductors such as gallium nitride (GaN) have been put into practice.

Since wide GaN substrate cannot be produced, the LEDs have been produced upon a heteroepitaxial substrate such as sapphire. The use of sapphire substrate is problematic due to lattice mismatch and thermal expansion mismatch between GaN and the sapphire substrate. One consequence of thermal expansion mismatch is bowing of the GaN/sapphire substrate structure, which results in cracking and difficulty in fabricating devices with small feature sizes. A method for solving the problem is forming a plurality of grooves on surface of the sapphire substrate by lithography or etching. However, the process of lithography and etching are complex, high in cost, and may pollute the sapphire substrate.

What is needed, therefore, is to provide an epitaxial method for solving the problem discussed above.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

References will now be made to the drawings to describe, in detail, various embodiments of the present epitaxial structures and methods for making the same.

Figure 1:
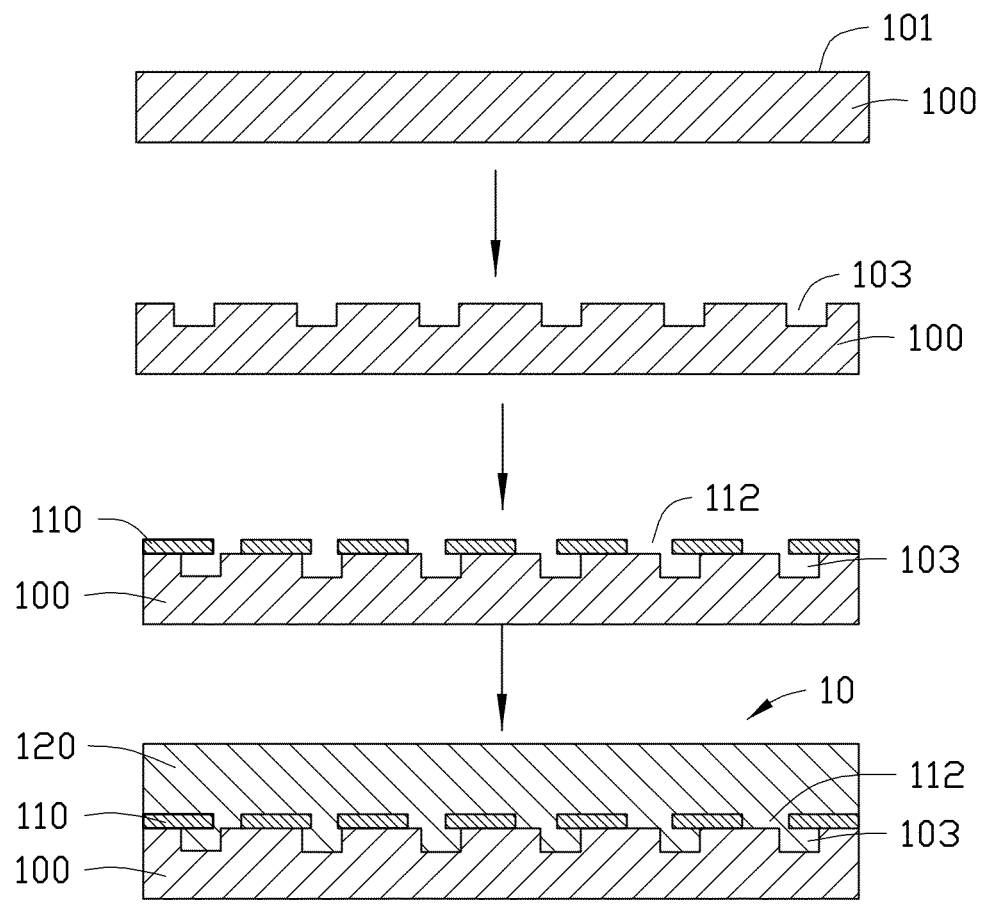
FIG. 1 is a flowchart of one embodiment of a method for making an epitaxial structure.

Referring to FIG. 1, a method for making an epitaxial structure 10 of one embodiment includes following steps:

(S11) providing a substrate 100 having an epitaxial growth surface 101;

(S12) etching the epitaxial growth surface 101 to form a patterned epitaxial growth surface; and (S13) placing a graphene layer 110 on the patterned epitaxial growth surface; and (S14) epitaxially growing an epitaxial layer 120 on the patterned epitaxial growth surface.

In step (S11), the epitaxial growth surface 101 is used to grow an epitaxial layer 120. The epitaxial growth surface 101 is a clean and smooth surface. Oxygen and carbon are removed from the surface. The substrate 100 can be a single layer structure or a multiple layer structure. If the substrate 100 is a single layer structure, the substrate 100 can be a single-crystal structure. The single-crystal structure includes a crystal face which is used as the epitaxial growth surface 101. The material of the substrate 100 can be SOI (Silicon on insulator), $LiGaO_2$, $LiAlO_2$, $Al_2O_3$, Si, GaAs, GaN, GaSb, InN, InP, InAs, InSb, AlP, AlAs, AlSb, AN, GaP, SiC, SiGe, GaMnAs, GaAlAs, GaInAs, GaAlN, GaInN, AlInN, GaAsP, InGaN, AlGaInN, AlGaInP, GaP:Zn or GaP:N. The material of the substrate 100 is not limited, as long as the substrate 100 has an epitaxial growth surface 101 on which the epitaxial layer 120 can grow. If the substrate 100 is a multiple layer structure, the substrate 100 should include at least one layer of the single-crystal structure mentioned previously. The material of the substrate 100 can be selected according to the epitaxial layer 120. In one embodiment, the lattice constant and thermal expansion coefficient of the substrate 100 is similar to the epitaxial layer 120 thereof in order to improve the quality of the epitaxial layer 120. In another embodiment, the material of the substrate 100 is sapphire. The thickness and the shape of the substrate 100 are arbitrary and can be selected according to need.

Figure 2:
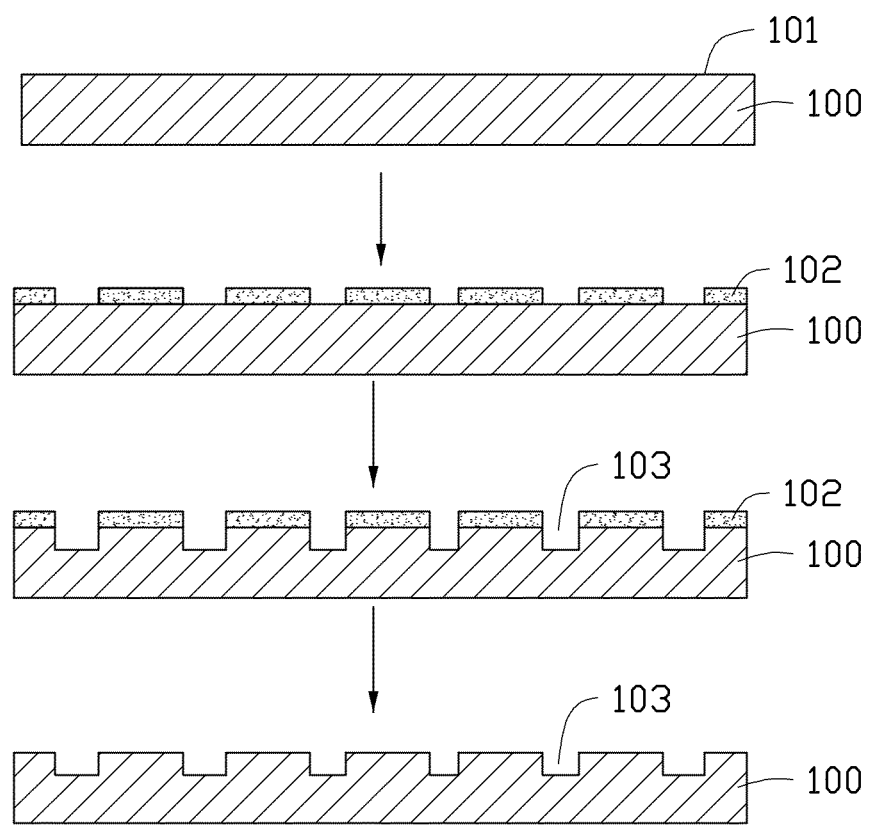
FIG. 2 is a flowchart of one embodiment of a method for making a patterned substrate.

In step (S12), the epitaxial growth surface 101 can be etched via a method of wet etching or dry etching. Also referring to FIG. 2, the epitaxial growth surface 101 is etched via the wet etching method in one embodiment. The method includes following steps:

(S121) placing a patterned mask layer 102 on the epitaxial growth surface 101;

(S122) etching the epitaxial growth surface 101 to form a patterned epitaxial growth surface; and (S123) removing the mask layer 102.

In step (S121), the material of the mask layer 102 can be selected according to need, such as silicon dioxide, silicon nitride, silicon oxynitride, or titanium dioxide. The mask layer 102 can protect one part of the substrate 100 which is sheltered by the mask layer 102 from being corrupted by the solution. In one embodiment, the mask layer 102 is formed by following steps:

(S1211) depositing a silicon dioxide film on the epitaxial growth surface 101; and (S1212) etching the silicon dioxide film via the lithography method to form a patterned mask layer 102.

In step (S1211), the silicon dioxide film can be deposited via the CVD method. The thickness of the silicon dioxide ranges from about 0.3 micrometer to about 2 micrometer.

In step (S1212), the silicon dioxide film is etched by following steps:

first, placing a photo resist on the silicon dioxide film;

second, exposing and developing the photo resist to form a patterned photo resist; and third, etching the silicon dioxide film with a solution composed of $HF_4$ and the $NH_4F$ to form the patterned mask layer 102.

The pattern of the mask layer 102 is arbitrary and can be selected according to need. The pattern can be an array which is composed of a plurality of units. The shape of the unit can be round, rectangle, hexagonal, diamond, triangle or irregular shape or any combinations of them. In one embodiment, the shape of the unit is rectangle. The rectangles are parallel with each other and spaced in a certain interval. The distance between the two adjacent units ranges from about 1 μm to about 20 μm. The width of the rectangle ranges from about 1 μm to about 50 μm.

In step (S122), the epitaxial growth surface 101 is etched by a solution comprising sulfuric acid and phosphoric acid. A first part of the epitaxial growth surface 101 which is sheltered by the mask layer 102 will be retained, and a second part of the epitaxial growth surface 101 which is exposed from the mask layer 102 will be dissolved in the solution. Thus the epitaxial growth surface 101 is patterned. The volume ratio between the sulfuric acid and the phosphoric acid ranges from about 1:3 to about 3:1. The etching temperature ranges from about 300° C. to about 500° C., and the etching time ranges from about 30 seconds to about 30 minutes. The etching time can be selected according to the etching depth.

Figure 3:
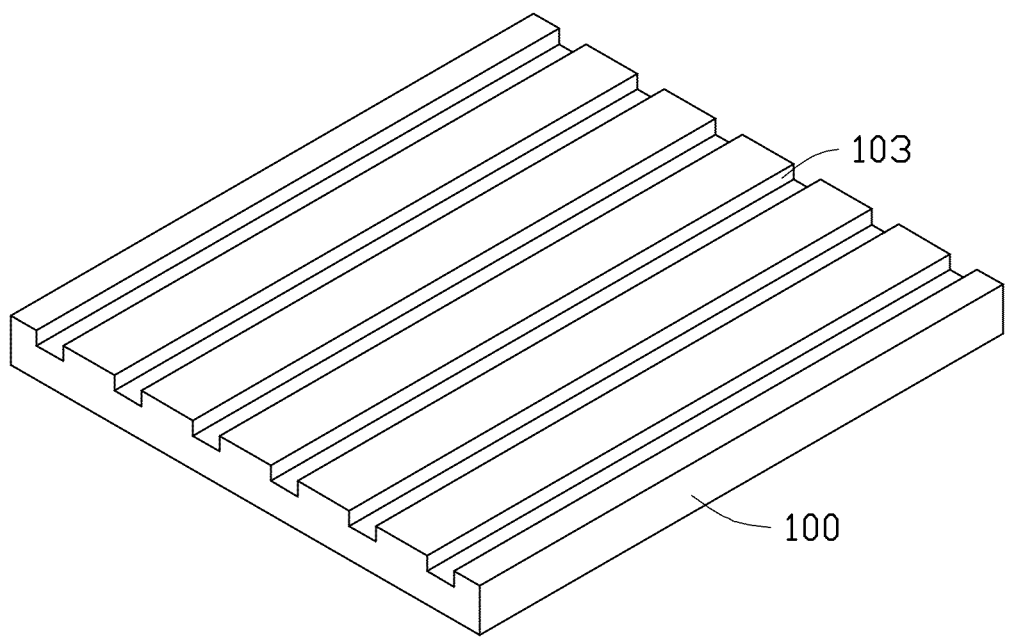
FIG. 3 is a schematic view of the patterned substrate in the method of FIG. 2.

Also referring to FIG. 3, the pattern of the patterned substrate 100 is similar to that of the mask layer 102. In one embodiment, the substrate 100 defines a plurality of grooves 103 parallel with each other on the epitaxial growth surface 101. The grooves 103 are depressed from the epitaxial growth surface 101 into the substrate 100. The grooves 103 extend along the same direction. On the direction perpendicular with the extending direction of the grooves 103, the grooves 103 are spaced from each other with an interval. The interval between adjacent two of the grooves 103 can be the same. The width of the grooves 103 ranges from about 1 μm to about 50 μm, and the interval between adjacent two of the grooves 103 ranges from about 1 μm to about 20 μm. The depth of the grooves 103 ranges from about 0.1 μm to about 1 μm. The depth of the grooves 103 can be selected according to need. Furthermore, the depth of the grooves 103 can be the same.

In step (S123), the mask layer 102 can be removed by dissolving in a $HF_4$ solution. Furthermore, the surface of the substrate 100 can be washed with de-ionized water to remove the residual impurity such as $HF_4$.

In step (S13), the graphene layer 110 is directly in contact with the substrate 100, and covers the patterned epitaxial growth surface. The graphene layer 110 includes a first part and a second part. The first part covers the epitaxial growth surface 101 which located between adjacent two of the grooves 103. The second portion is suspended above the grooves 103, and not contacts with the epitaxial growth surface 101.

The graphene layer 110 can include at least one graphene film. The graphene film, namely a single-layer graphene, is a single layer of continuous carbon atoms. The single-layer graphene is a nanometer-thick two-dimensional analog of fullerenes and carbon nanotubes. When the graphene layer 110 includes the at least one graphene film, a plurality of graphene films can be stacked on each other or arranged coplanar side by side. The graphene film can be patterned by cutting or etching. The thickness of the graphene layer 110 can be in a range from about 1 nanometer to about 100 micrometers. For example, the thickness of the graphene layer 110 can be 1 nanometer, 10 nanometers, 200 nanometers, 1 micrometer, or 10 micrometers. The single-layer graphene can have a thickness of a single carbon atom. In one embodiment, the graphene layer 110 is a pure graphene structure consisting of graphene.

The single-layer graphene has very unique properties. The single-layer graphene is almost completely transparent. The single-layer graphene absorbs only about 2.3% of visible light and allows most of the infrared light to pass through. The thickness of the single-layer graphene is only about 0.34 nanometers. A theoretical specific surface area of the single-layer grapheme is $2630\ m^2 \cdot g^{-1}$. The tensile strength of the single-layer graphene is 125 GPa, and the Young's modulus of the single-layer graphene can be as high as 1.0 TPa. The thermal conductivity of the single-layer graphene is measured at $5300\ W \cdot m^{-1} \cdot K^{-1}$. A theoretical carrier mobility of the single-layer graphene is $2 \times 10^5\ cm^2 \cdot V^{-1} \cdot s^{-1}$. A resistivity of the single-layer graphene is $1 \times 10^{-6}\ \Omega \cdot cm$ which is about ⅔ of a resistivity of copper. Phenomenon of quantum Hall effects and scattering-free transmissions can be observed on the single-layer grapheme at room temperature.

Figure 4:
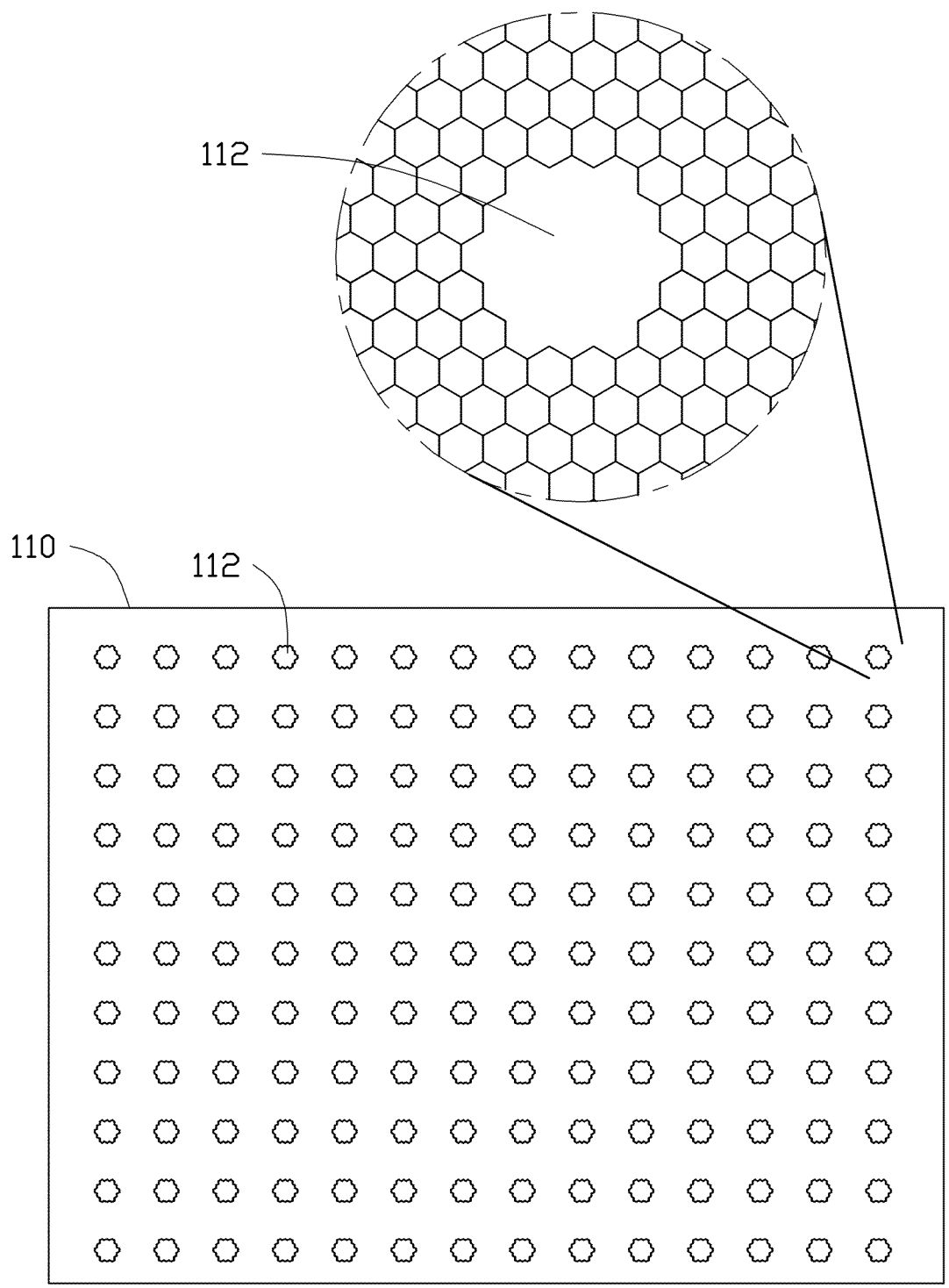
FIG. 4 is a schematic view of one embodiment of a graphene layer having a plurality of hole shaped apertures.
Figure 5:
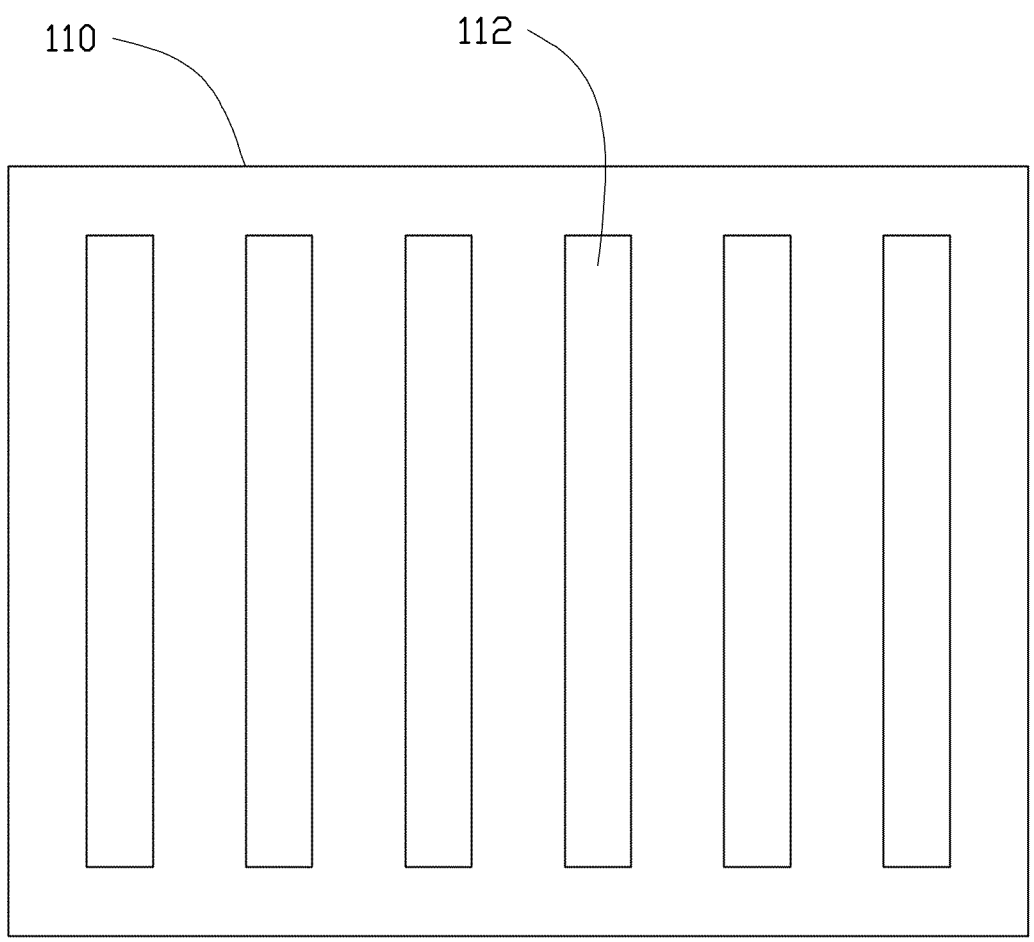
FIG. 5 is a schematic view of one embodiment of a graphene layer having a plurality of rectangular shaped apertures.
Figure 6:
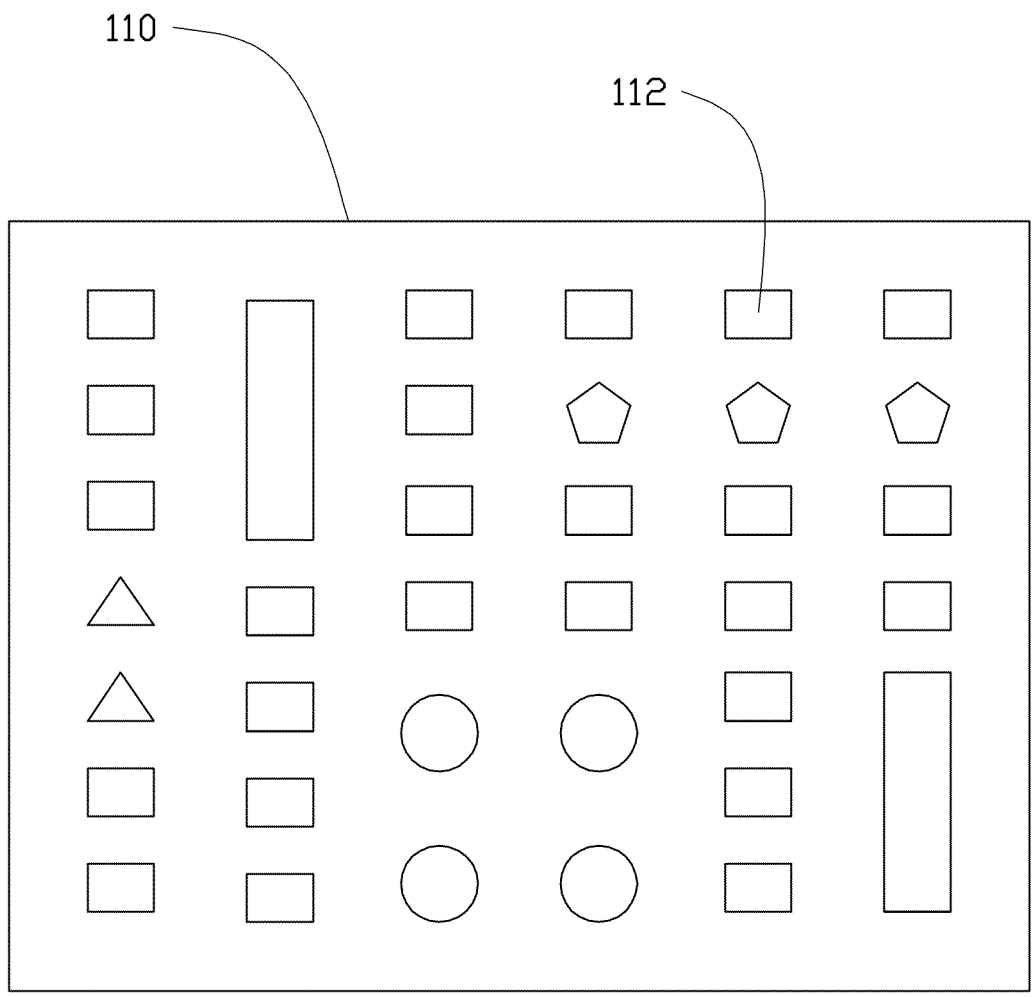
FIG. 6 is a schematic view of one embodiment of a graphene layer having a plurality of apertures in different shapes.

In one embodiment, the graphene layer 110 is a patterned structure. As shown in FIGS. 4-6, the term "patterned structure" means the graphene layer 110 is a continuous structure and defines a plurality of apertures 112. When the graphene layer 110 is located on the epitaxial growth surface 101, part of the epitaxial growth surface 101 is exposed from the apertures 112 to grow the epitaxial layer 120.

The shape of the apertures 112 is not limited and can be round, square, triangular, diamond or rectangular. The graphene layer 110 can have the apertures 112 of all the same shape or of different shapes. The apertures 112 can be dispersed uniformly on the grapheme layer 110. Each of the apertures 112 extends through the graphene layer 110 along the thickness direction. The apertures 112 can be a circular hole as shown in FIG. 4 or rectangular hole as shown in FIG. 5. Alternatively, the apertures 112 can be a mixture of circular hole and rectangular hole in the patterned graphene layer 110, as shown in FIG. 6. Hereafter, the size of the apertures 112 is the diameter of the circle or width of the rectangle. The sizes of the apertures 112 can be different. The average size of the apertures 112 can be in a range from about 10 nanometers to about 500 micrometers. For example, the sizes of the apertures 112 can be about 50 nanometers, 100 nanometers, 500 nanometers, 1 micrometer, 10 micrometers, 80 micrometers, or 120 micrometers. The smaller the sizes of the apertures 112, the less dislocation defects will occur during the process of growing the epitaxial layer 120. In one embodiment, the sizes of the apertures 112 are in a range from about 10 nanometers to about 10 micrometers. A dutyfactor of the graphene layer 110 is an area ratio between the sheltered epitaxial growth surface 101 and the exposed epitaxial growth surface 101. The dutyfactor of the graphene layer 110 can be in a range from about 1:100 to about 100:1. For example, the dutyfactor of the graphene layer 110 can be about 1:10, 1:2, 1:4, 4:1, 2:1, or 10:1. In one embodiment, the dutyfactor of the graphene layer 110 is in a range from about 1:4 to about 4:1.

Figure 7:
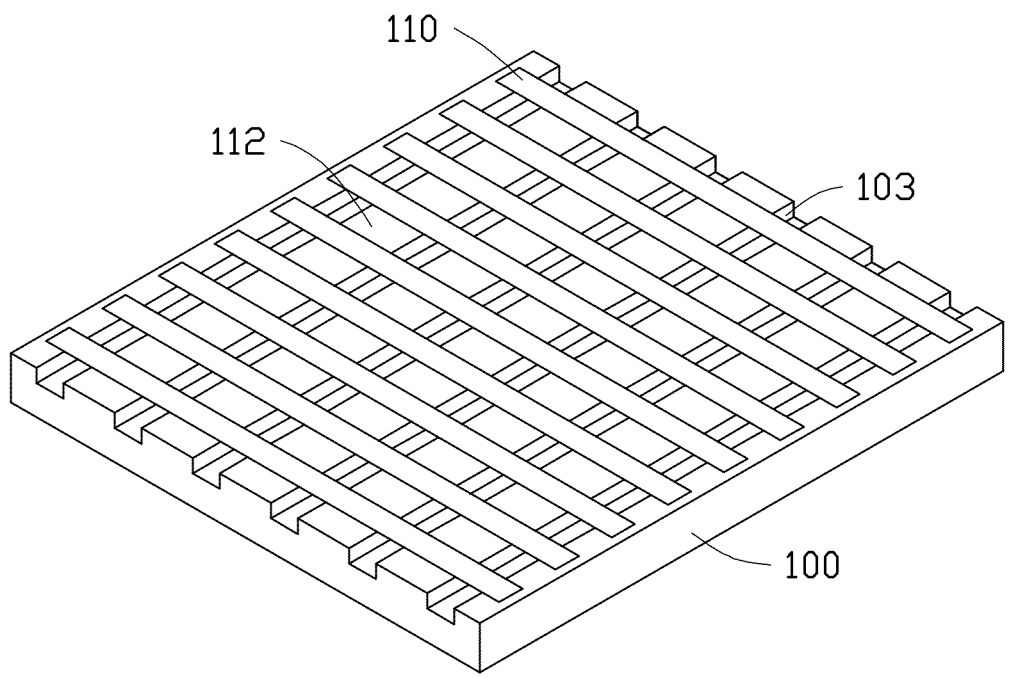
FIG. 7 is a schematic view of one embodiment of a plurality of sub graphene layers spaced from each other.

As shown in FIG. 7, the term "patterned structure" can also be a plurality of patterned graphene layers spaced from each other. Each of the apertures 112 is defined between adjacent two of the patterned graphene layers 110. When the graphene layer 110 is located on the epitaxial growth surface 101, part of the epitaxial growth surface 101 is exposed from the aperture 112 to grow the epitaxial layer 120. In one embodiment, the graphene layer 110 includes a plurality of graphene strips placed in parallel with each other and spaced from each other as shown in FIG. 7.

The graphene layer 110 can be located on the epitaxial growth surface 101 by transfer printing a preformed graphene film. The graphene film can be made by chemical vapor deposition, exfoliating graphite, electrostatic deposition, pyrolysis of silicon carbide, epitaxial growth on silicon carbide, or epitaxial growth on metal substrates.

In one embodiment, the graphene layer 110 of FIG. 4 can be made by following steps:

(S131) providing a graphene film;
(S132) transferring the graphene film on the patterned epitaxial growth surface of the substrate 100; and
(S133) creating patterns on the graphene film.

In step (131), the graphene film is made by chemical vapor deposition which includes the steps of: (a1) providing a substrate; (b1) depositing a metal catalyst layer on the substrate; (c1) annealing the metal catalyst layer; and (d1) growing the graphene film in a carbon source gas.

In step (a1), the substrate can be a copper foil or a Si/SiO$_2$ wafer. The Si/SiO$_2$ wafer can have a Si layer with a thickness in a range from about 300 micrometers to about 1000 micrometers and a SiO$_2$ layer with a thickness in a range from about 100 nanometers to about 500 nanometers. In one embodiment, the Si/SiO$_2$ wafer has a Si layer with a thickness of about 600 micrometers and a SiO$_2$ layer with a thickness of about 300 nanometers.

In step (b1), the metal catalyst layer can be made of nickel, iron, or gold. The thickness of the metal catalyst layer can be in a range from about 100 nanometers to about 800 nanometers. The metal catalyst layer can be made by chemical vapor deposition, physical vapor deposition, such as magnetron sputtering or electron beam deposition. In one embodiment, a metal nickel layer of about 500 nanometers is deposited on the SiO$_2$ layer.

In step (c1), the annealing temperature can be in a range from about 900° C. to about 1000° C. The annealing can be performed in a mixed gas of argon gas and hydrogen gas. The flow rate of the argon gas is about 600 sccm, and the flow rate of the hydrogen gas is about 500 sccm. The annealing time is in a range from about 10 minutes to about 20 minutes.

In step (d1), the growth temperature is in a range from about 900° C. to about 1000° C. The carbon source gas is methane. The growth time is in a range from about minutes to about 10 minutes.

In step (132), the transferring the graphene film includes the steps of: (a2) coating an organic colloid or polymer on the surface of the graphene film as a supporter; (b2) baking the organic colloid or polymer on the graphene film; (c2) immersing the baked graphene film with the Si/SiO$_2$ substrate in deionized water so that the metal catalyst layer and the SiO$_2$ layer was separated to obtain a supporter/graphene film/metal catalyst layer composite; (d2) removing the metal catalyst layer from the supporter/graphene film/metal catalyst layer composite to obtain a supporter/graphene film composite; (e2) placing the supporter/graphene film composite on the epitaxial growth surface 101; (f2) fixing the graphene film on the epitaxial growth surface 101 firmly by heating; and (g2) removing the supporter.

In step (a2), the supporter material is poly (methyl methacrylate) (PMMA), polydimethylsiloxane, positive photoresist 9912, or photoresist AZ5206.

In step (b2), the baking temperature is in a range from about 100° C. to about 185° C.

In step (c2), an ultrasonic treatment on the metal catalyst layer and the SiO$_2$ layer can be performed after being immersed in deionized water.

In step (d2), the metal catalyst layer is removed by chemical liquid corrosion. The chemical liquid can be nitric acid, hydrochloric acid, ferric chloride (FeCl$_3$), and ferric nitrate (Fe(NO$_3$)$_3$).

In step (g2), the supporter is removed by soaking the supporter in acetone and ethanol first, and then heating the supporter to about 400° C. in a protective gas.

In step (133), the method of creating patterns on the graphene film can be photocatalytic titanium oxide cutting, ion beam etching, atomic force microscope etching, or the plasma etching. In one embodiment, an anodic aluminum oxide mask is placed on the surface of the graphene film, and then the graphene film is etched by plasma. The anodic aluminum oxide mask has a plurality of micropores arranged in an array. The part of the graphene film corresponding to the micropores of the anodic aluminum oxide mask will be removed by the plasma etching, thereby obtaining a graphene layer 110 having a plurality of apertures.

In one embodiment, photocatalytic titanium oxide cutting is used to pattern the continuous graphene coating. The method includes following steps:

(S133a) making a patterned metal titanium layer;
(S133b) heating and oxidizing the patterned metal titanium layer to obtain a patterned titanium dioxide layer;
(S133c) contacting the patterned titanium dioxide layer with the continuous graphene coating;
(S133d) irradiating the patterned titanium dioxide layer with ultraviolet light; and
(S133e) removing the patterned titanium dioxide layer.

In step (S133a), the patterned metal titanium layer can be formed by vapor deposition through a mask or photolithography on a surface of a quartz substrate. The thickness of the quartz substrate can be in a range from about 300 micrometers to about 1000 micrometers. The thickness of the metal titanium layer can be in a range from about 3 nanometers to about 10 nanometers. In one embodiment, the quartz substrate has a thickness of 500 micrometers, and the metal titanium layer has a thickness of 4 nanometers. The patterned metal titanium layer is a continuous titanium layer having a plurality of spaced strip-shaped openings.

In step (S133b), the patterned metal titanium layer is heated under conditions of about 500° C. to about 600° C. for about 1 hour to about 2 hours. The heating can be performed on a furnace.

In step (S133d), the ultraviolet light has a wavelength of about 200 nanometers to about 500 nanometers. The patterned titanium dioxide layer is irradiated by the ultraviolet light in air or oxygen atmosphere with a humidity of about 40% to about 75%. The irradiating time is about 30 minutes to about 90 minutes. Because the titanium dioxide is a semiconductor material with photocatalytic property, the titanium dioxide can produce electrons and holes under ultraviolet light irradiation. The electrons will be captured by the Ti (IV) of the titanium surface, and the holes will be captured by the lattice oxygen. Thus, the titanium dioxide has strong oxidation-reduction ability. The captured electrons and holes are easy to oxidize and reduce the water vapor in the air to produce active substance such as $O_2$ and $H_2O_2$. The active substance can decompose the graphene material easily.

In step (S133e), the patterned titanium dioxide layer can be removed by removing the quartz substrate. After removing the patterned titanium dioxide layer, the patterned graphene layer 110 can be obtained. The pattern of the patterned graphene layer 110 and the pattern of the patterned titanium dioxide layer are mutually engaged with each other. Namely, the part of the continuous graphene coating corresponding to the patterned titanium dioxide layer will be removed.

In other embodiment, in step (S133a), the patterned metal titanium layer can be formed by depositing titanium on a patterned carbon nanotube structure directly. The carbon nanotube structure can be a carbon nanotube film or a plurality of carbon nanotube wires. The plurality of carbon nanotube wires can be crossed or weaved together to form a carbon nanotube structure. The plurality of carbon nanotube wires can also be located in parallel and spaced from each other to form a carbon nanotube structure. Because a plurality of apertures is formed in the carbon nanotube film or between the carbon nanotube wires, the carbon nanotube structure can be patterned. The titanium deposited on the patterned carbon nanotube structure can form a patterned titanium layer. In step (S133b), the patterned titanium layer can be heated by applying an electric current through the patterned carbon nanotube structure. In step (S133d), the part of the continuous graphene coating corresponding to the patterned carbon nanotube structure will be removed off to form a plurality of apertures 112. Because the diameter of the carbon nanotube is about 0.5 nanometers to about 50 nanometers, the size of the apertures 112 can be several nanometers to tens nanometers. The size of the apertures 112 can be controlled by selecting the diameter of the carbon nanotube.

The carbon nanotube structure is a free-standing structure. The term "free-standing structure" means that the carbon nanotube structure can sustain the weight of itself when it is hoisted by a portion thereof without any significant damage to its structural integrity. That is, the carbon nanotube structure can be suspended by two spaced supports. Thus, the process of creating patterns on the continuous graphene coating can be operated as follow. For example, first depositing titanium layer on a plurality of parallel carbon nanotube wires; second heating and oxidizing the titanium layer on the plurality of carbon nanotube wires form titanium dioxide layer; third locating the plurality of carbon nanotube wires on the continuous graphene coating; fourth irradiating the plurality of carbon nanotube wires with the ultraviolet light; last removing the plurality of carbon nanotube wires to obtain a graphene layer 110 having a plurality of rectangular shaped apertures 112.

Figure 8:
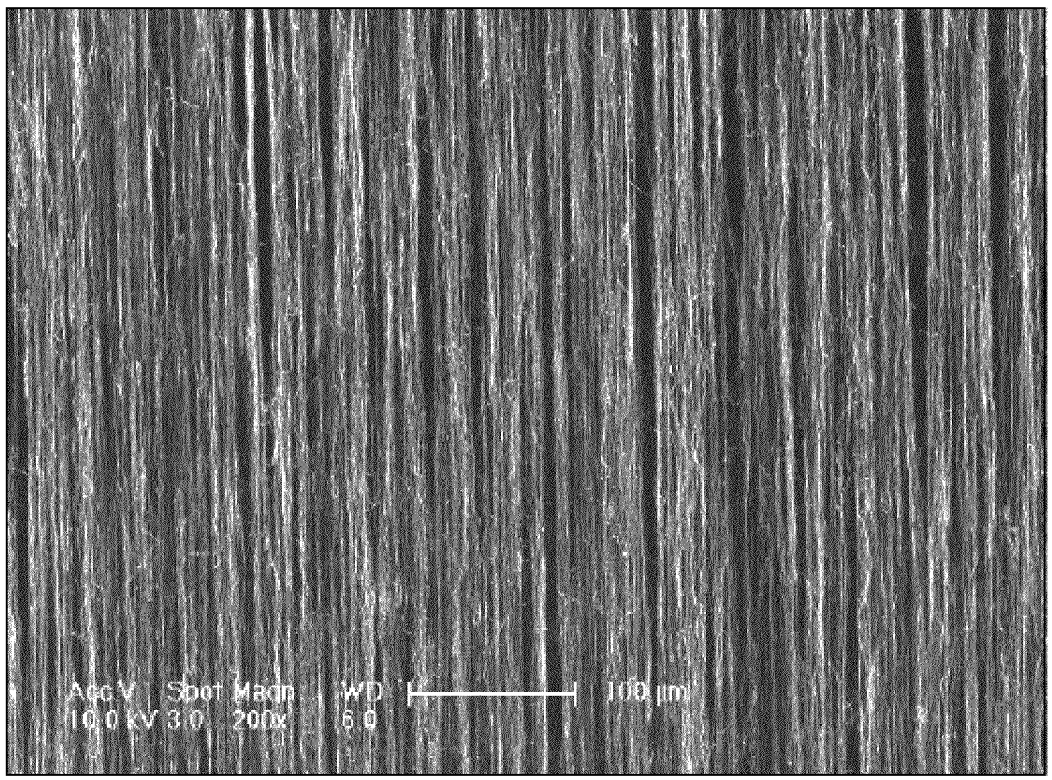
FIG. 8 is a scanning electron microscope (SEM) image of a drawn carbon nanotube film.
Figure 9:
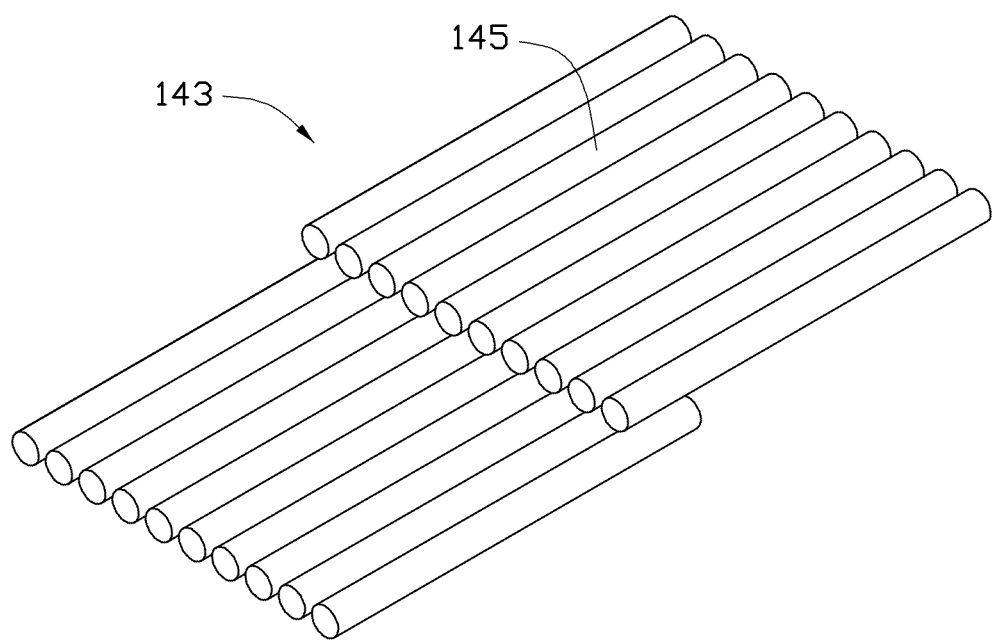
FIG. 9 is a schematic structural view of a carbon nanotube segment of the drawn carbon nanotube film of FIG. 8.

In one embodiment, the carbon nanotube structure includes at least one drawn carbon nanotube film. A drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIGS. 8-9, each drawn carbon nanotube film includes a plurality of successively oriented carbon nanotube segments 143 joined end-to-end by van der Waals attractive force therebetween. Each carbon nanotube segment 143 includes a plurality of carbon nanotubes 145 parallel to each other, and combined by van der Waals attractive force therebetween. As can be seen in FIG. 8, some variations can occur in the drawn carbon nanotube film. The carbon nanotubes 145 in the drawn carbon nanotube film are oriented along a preferred orientation. The drawn carbon nanotube film can be treated with an organic solvent to increase the mechanical strength and toughness and reduce the coefficient of friction of the drawn carbon nanotube film. A thickness of the drawn carbon nanotube film can range from about 0.5 nanometers to about 100 micrometers. The drawn carbon nanotube film can be attached to the epitaxial growth surface 101 directly.

Figure 10:
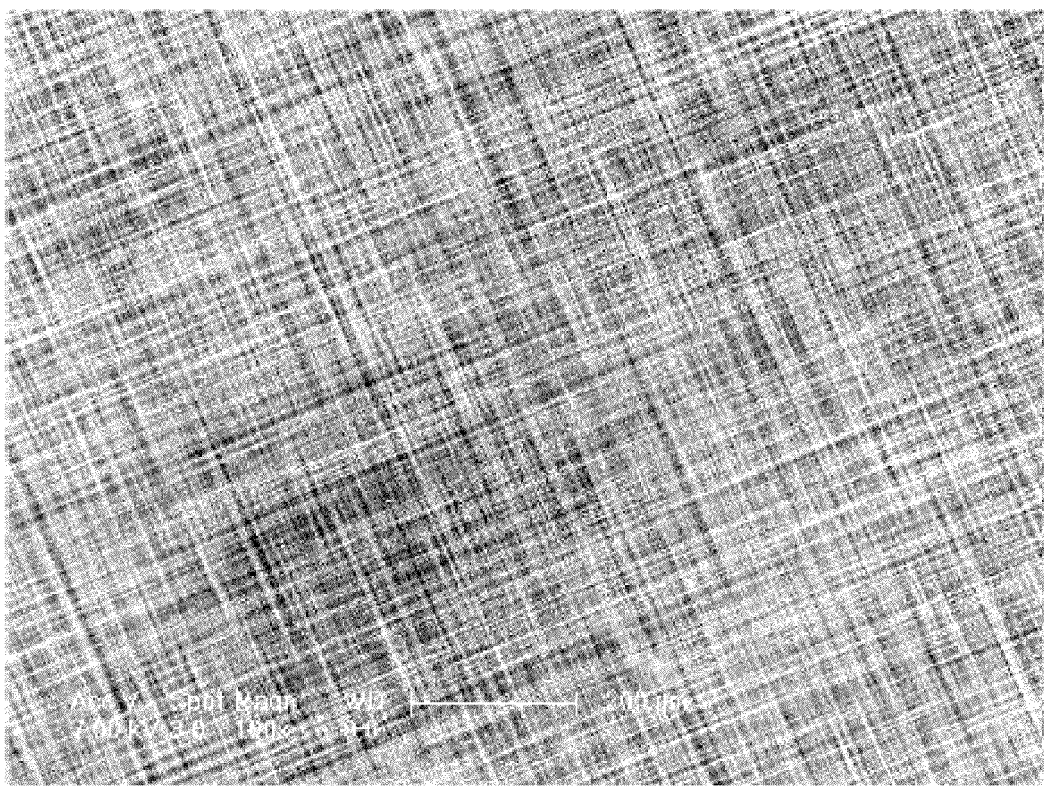
FIG. 10 is an SEM image of cross-stacked drawn carbon nanotube films.

The carbon nanotube structure can include at least two stacked drawn carbon nanotube films. In other embodiments, the carbon nanotube structure can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be combined by only the van der Waals attractive force therebetween. An angle between the aligned directions of the carbon nanotubes in two adjacent carbon nanotube films can range from about 0 degrees to about 90 degrees. When the angle between the aligned directions of the carbon nanotubes in adjacent stacked drawn carbon nanotube films is larger than 0 degrees, a plurality of micropores is defined by the carbon nanotube structure. Referring to FIG. 10, the carbon nanotube structure is shown with the aligned directions of the carbon nanotubes between adjacent stacked drawn carbon nanotube films at 90 degrees. Stacking the carbon nanotube films will also add to the structural integrity of the carbon nanotube structure.

A step of heating the drawn carbon nanotube film can be performed to decrease the thickness of the drawn carbon nanotube film. The drawn carbon nanotube film can be partially heated by a laser or microwave. The thickness of the drawn carbon nanotube film can be reduced because some of the carbon nanotubes will be oxidized. In one embodiment, the drawn carbon nanotube film is irradiated by a laser device in an atmosphere comprising of oxygen therein. The power density of the laser is greater than $0.1 \times 10^4$ watts per square meter. The drawn carbon nanotube film can be heated by fixing the drawn carbon nanotube film and moving the laser device at a substantially uniform speed to irradiate the drawn carbon nanotube film. When the laser irradiates the drawn carbon nanotube film, the laser is focused on the surface of the drawn carbon nanotube film to form a laser spot. The diameter of the laser spot ranges from about 1 micron to about 5 millimeters. In one embodiment, the laser device is carbon dioxide laser device. The power of the laser device is about 30 watts. The wavelength of the laser is about 10.6 micrometers. The diameter of the laser spot is about 3 millimeters. The velocity of the laser movement is less than 10 millimeters per second. The power density of the laser is $0.053 \times 10^{12}$ watts per square meter.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes, and thus, the drawn carbon nanotube film will be shrunk into an untwisted carbon nanotube wire. The untwisted carbon nanotube wire includes a plurality of carbon nanotubes substantially oriented along a same direction (i.e., a direction along the length of the untwisted carbon nanotube wire). The carbon nanotubes are substantially parallel to the axis of the untwisted carbon nanotube wire. More specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. The length of the untwisted carbon nanotube wire can be arbitrarily set as desired. A diameter of the untwisted carbon nanotube wire ranges from about 0.5 nanometers to about 100 micrometers.

The twisted carbon nanotube wire can be formed by twisting a drawn carbon nanotube film using a mechanical force to turn the two ends of the drawn carbon nanotube film in opposite directions. The twisted carbon nanotube wire includes a plurality of carbon nanotubes helically oriented around an axial direction of the twisted carbon nanotube wire. Specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. The length of the carbon nanotube wire can be set as desired. A diameter of the twisted carbon nanotube wire can be from about 0.5 nanometers to about 100 micrometers. Further, the twisted carbon nanotube wire can be treated with a volatile organic solvent after being twisted to bundle the adjacent paralleled carbon nanotubes together. The specific surface area of the twisted carbon nanotube wire will decrease, while the density and strength of the twisted carbon nanotube wire will increase.

The graphene layer 110 can be used as a mask for growing the epitaxial layer 120. The mask is the patterned graphene layer 110 sheltering a part of the epitaxial growth surface 101 and exposing another part of the epitaxial growth surface 101. Thus, the epitaxial layer 120 can grow from the exposed epitaxial growth surface 101. The graphene layer 110 can form a patterned mask on the epitaxial growth surface 101 because the patterned graphene layer 110 defines a plurality of apertures 112. Compared to lithography or etching, the method of forming a patterned graphene layer 110 as mask is simple, low in cost, and will not pollute the substrate 100.

In step (S14), the epitaxial layer 120 can be grown by a method such as molecular beam epitaxy, chemical beam epitaxy, reduced pressure epitaxy, low temperature epitaxy, select epitaxy, liquid phase deposition epitaxy, metal organic vapor phase epitaxy, ultra-high vacuum chemical vapor deposition, hydride vapor phase epitaxy, or metal organic chemical vapor deposition (MOCVD).

The epitaxial layer 120 is a single crystal layer grown on the patterned epitaxial growth surface by epitaxy growth method. The material of the epitaxial layer 120 can be the same as or different from the material of the substrate 100. If the epitaxial layer 120 and the substrate 100 are the same material, the epitaxial layer 120 is called a homogeneous epitaxial layer. If the epitaxial layer 120 and the substrate 100 have different material, the epitaxial layer 120 is called a heteroepitaxial epitaxial layer. The material of the epitaxial layer 120 can be semiconductor, metal or alloy. The semiconductor can be Si, GaAs, GaN, GaSb, InN, InP, InAs, InSb, AlP, AlAs, AlSb, AN, GaP, SiC, SiGe, GaMnAs, GaAlAs, GaInAs, GaAlN, GaInN, AlInN, GaAsP, InGaN, AlGaInN, AlGaInP, GaP:Zn, or GaP:N. The metal can be aluminum, platinum, copper, or silver. The alloy can be MnGa, CoMnGa, or $Co_2MnGa$. The thickness of the epitaxial layer 120 can be prepared according to need. The thickness of the epitaxial layer 120 can be in a range from about 100 nanometers to about 500 micrometers. For example, the thickness of the epitaxial layer 120 can be about 200 nanometers, 500 nanometers, 1 micrometer, 2 micrometers, 5 micrometers, 10 micrometers, or 50 micrometers.

Figure 11:
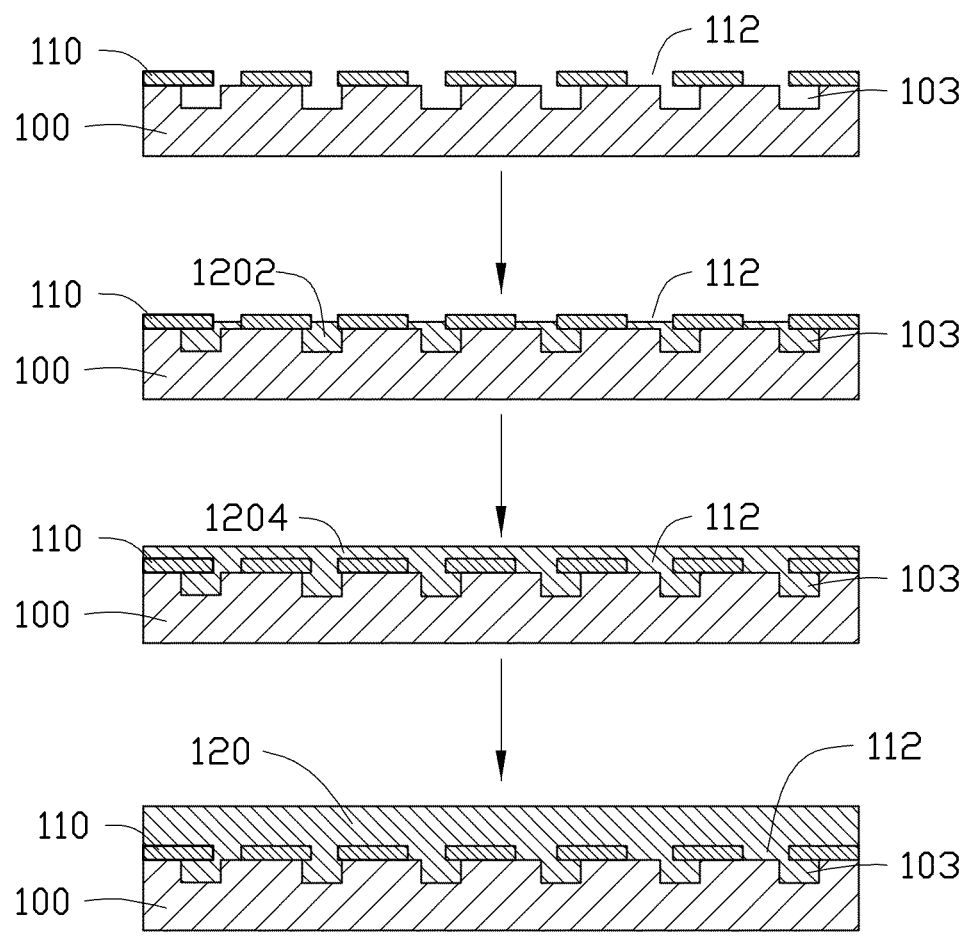
FIG. 11 is another process of growing an epitaxial layer.

Referring to FIG. 11, step (S14) includes the following substeps:

(S141) placing the substrate 100 with the graphene layer 110 thereon into a reaction chamber and heating the substrate 100 to 1100° C.~1200° C., introducing the carrier gas and baking the substrate 100 for about 200 seconds to about 1000 seconds;

(S142) cooling down the temperature to a range from about 500° C. to 650° C. in the carrier gas atmosphere, introducing the Ga source gas and the nitrogen source gas at the same time to grow the low-temperature GaN layer;

(S143) stopping introducing the Ga source gas in the carrier gas and nitrogen source gas atmosphere, increasing the temperature to a range from about 1100° C. to about 1200° C. and keeping for about 30 seconds to about 300 seconds;

(S154) keeping the temperature of the substrate 100 in a range from about 1000° C. to about 1100° C., introducing the Ga source gas again and the Si source gas to grow the epitaxial layer 120.

The growth of the epitaxial layer 120 includes following stages:

First stage, nucleating on the epitaxial growth surface 101 and growing a plurality of epitaxial crystal grains 1202 along the direction substantially perpendicular to the epitaxial growth surface 101;

Second stage, forming a continuous epitaxial film 1204 by making the epitaxial crystal grains 1202 grow along the direction substantially parallel to the epitaxial growth surface 101; and Third stage, forming the epitaxial layer 120 by making the epitaxial film 1204 grows along the direction substantially perpendicular to the epitaxial growth surface 101.

In the first stage, the epitaxial crystal grains 1202 grow from the exposed part of the epitaxial growth surface 101 and through the apertures 112. The process of the epitaxial crystal grains 1202 growing along the direction substantially perpendicular to the epitaxial growth surface 101 is called vertical epitaxial growth. The first part of the graphene layer 110 directly contacts and covers the epitaxial growth surface 101, the epitaxial crystal grains 1202 grow from the apertures 112 of the graphene layer 110. The second part of the graphene layer 110 is suspended on the grooves 103, thus the epitaxial crystal grains 1202 grow from the bottom of the grooves 103. While the crystal grains 1202 grow to the plane of the second part of the graphene layer 110, the crystal grains 1202 will grow out of the graphene layer 110 through the apertures 112.

In the second stage, the epitaxial crystal grains 1202 are joined together to form an integral structure (the epitaxial film 1204) to cover the graphene layer 110. The epitaxial crystal grains 1202 can grow along the direction parallel to the epitaxial growth surface 101. During the growth process, a plurality of holes will be formed in the epitaxial layer 120 where the graphene layer 110 existed. The epitaxial crystal grains 1202 grow and form a plurality of holes to enclose the graphene layer 110. The inner wall of the holes can be in contact with or spaced from the graphene layer 110, depending on whether the material of the epitaxial film 1204 and the graphene layer 110 have mutual infiltration. Thus, the epitaxial film 1204 defines a patterned depression on the surface adjacent to the epitaxial growth surface 101. The patterned depression is related to the patterned graphene layer 110. If the graphene layer 110 includes a plurality of graphene strips located in parallel with each other and spaced from each other, the patterned depression is a plurality of parallel and spaced grooves. If the graphene layer 110 includes a plurality of graphene strips crossed or weaved together to form a net, the patterned depression is a groove network including a plurality of intersected grooves. The graphene layer 110 can prevent lattice dislocation between the epitaxial crystal grains 1202 and the substrate 100 from growing. The process of epitaxial crystal grains 1202 growing along the direction substantially parallel to the epitaxial growth surface 101 is called lateral epitaxial growth.

In the third stage, the epitaxial layer 120 is obtained by growing for a long duration of time. Because the graphene layer 110 can prevent the lattice dislocation between the epitaxial crystal grains 1202 and the substrate 100 from growing in step (302), the epitaxial layer 120 has fewer defects therein.

Figure 12:
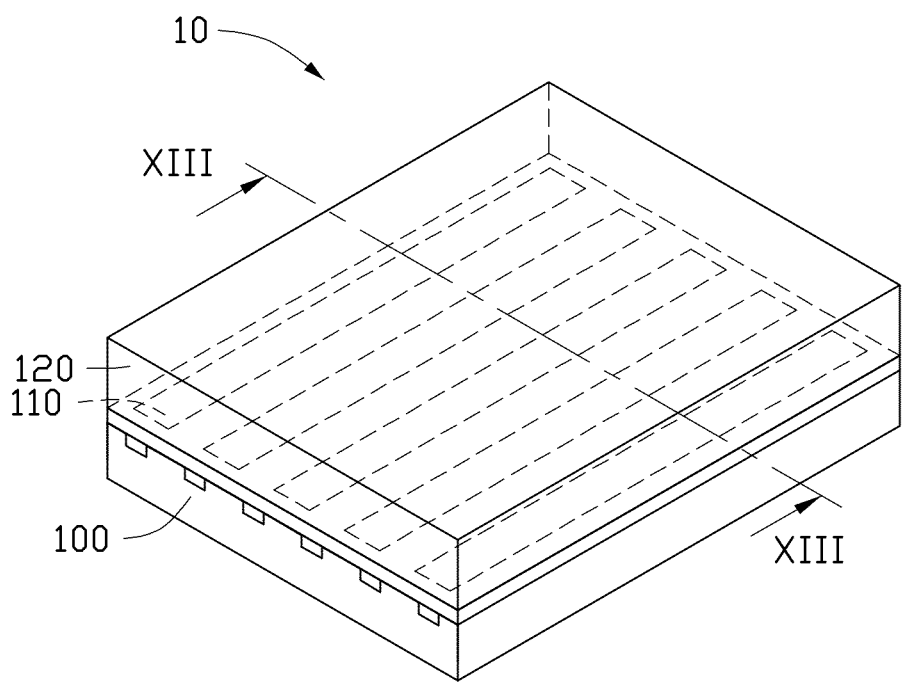
FIG. 12 is a schematic view of one embodiment of an epitaxial structure fabricated using the method of FIG. 1.
Figure 13:
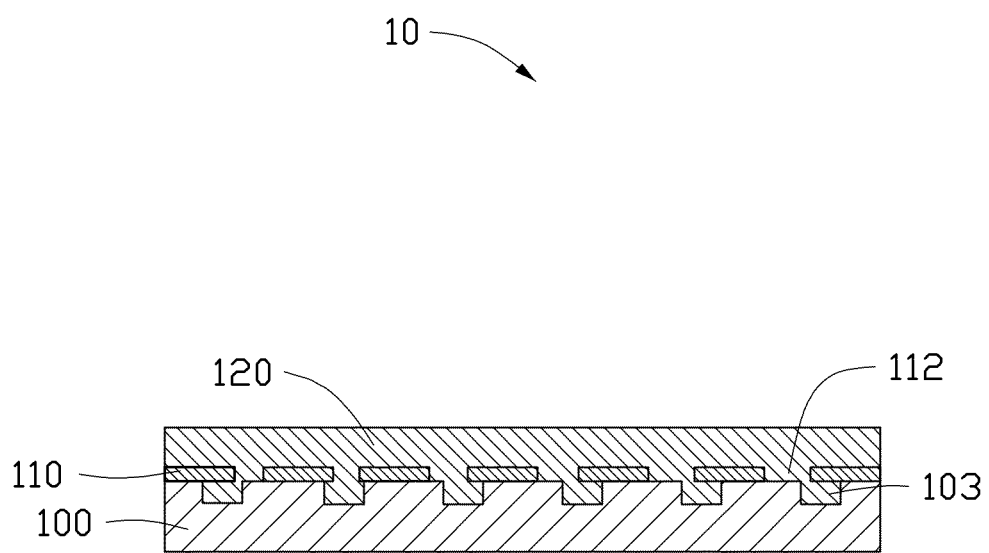
FIG. 13 is a schematic, cross-sectional view, along a line XIII-XIII of FIG. 12.

Referring to FIGS. 12 and 13, an epitaxial structure 10 provided in one embodiment includes a substrate 100, a graphene layer 110, and an epitaxial layer 120. A surface of the substrate 100 defines a plurality of grooves 103 to form a patterned epitaxial growth surface. The graphene layer 110 is located on the patterned epitaxial growth surface and defines a plurality of apertures 112. The patterned epitaxial surface of the substrate 100 is exposed through the plurality of apertures 112. The epitaxial layer 120 is located on the graphene layer 110 and contacts the exposed epitaxial growth surface through the apertures 112.

The graphene layer 110 includes a first part directly contacting with the patterned epitaxial growth surface between adjacent two of the grooves 103, and a second part suspended on the plurality of grooves 103, and spaced from bottom of the grooves 103. In one embodiment, the plurality of grooves 103 extends along the same direction. The epitaxial layer 120 covers the plurality of grooves 103 and connects to the substrate 100 through the plurality of apertures 112. The graphene layer 110 suspended on the plurality of grooves is embedded into the epitaxial layer 120. In one embodiment, the plurality of apertures 112 extends along the same direction and is parallel with the plurality of grooves 103. Furthermore, the extending direction of the plurality of apertures 112 can also be intersected with the extending direction of the plurality of the grooves 103.

The epitaxial layer 120 is coupled with the patterned epitaxial growth surface of the substrate 100. The term "coupled" means that a surface of the epitaxial layer 120 forms a plurality of bulges engaged with the plurality of grooves 103. The epitaxial layer 120 defines a plurality of holes, and the graphene layer 110 is embedded in the plurality of holes. The inner wall of the holes can be in contact with the graphene layer 110. In one embodiment, the graphene layer 110 includes a plurality of graphene strips located in parallel with each other and spaced from each other. A thickness of the epitaxial layer 120 ranges from about 0.5 nanometers to about 1 millimeters, such as 100 nanometers to about 500 nanometers, 200 nanometers to about 200 micrometers, or 500 nanometers to about 500 micrometers.

Figure 14:
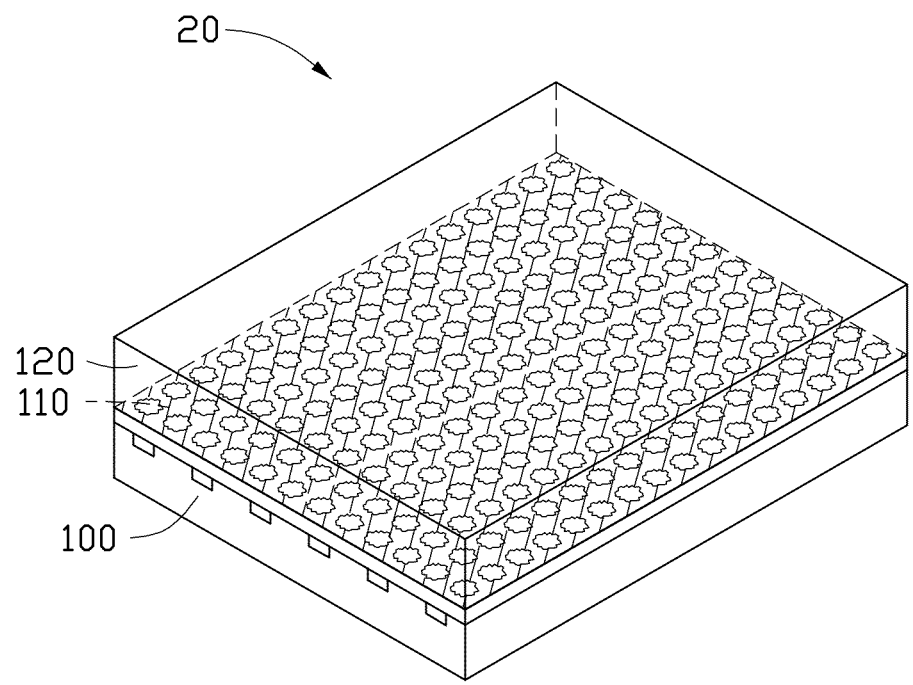
FIG. 14 is a schematic view of another embodiment of an epitaxial structure.
Figure 15:
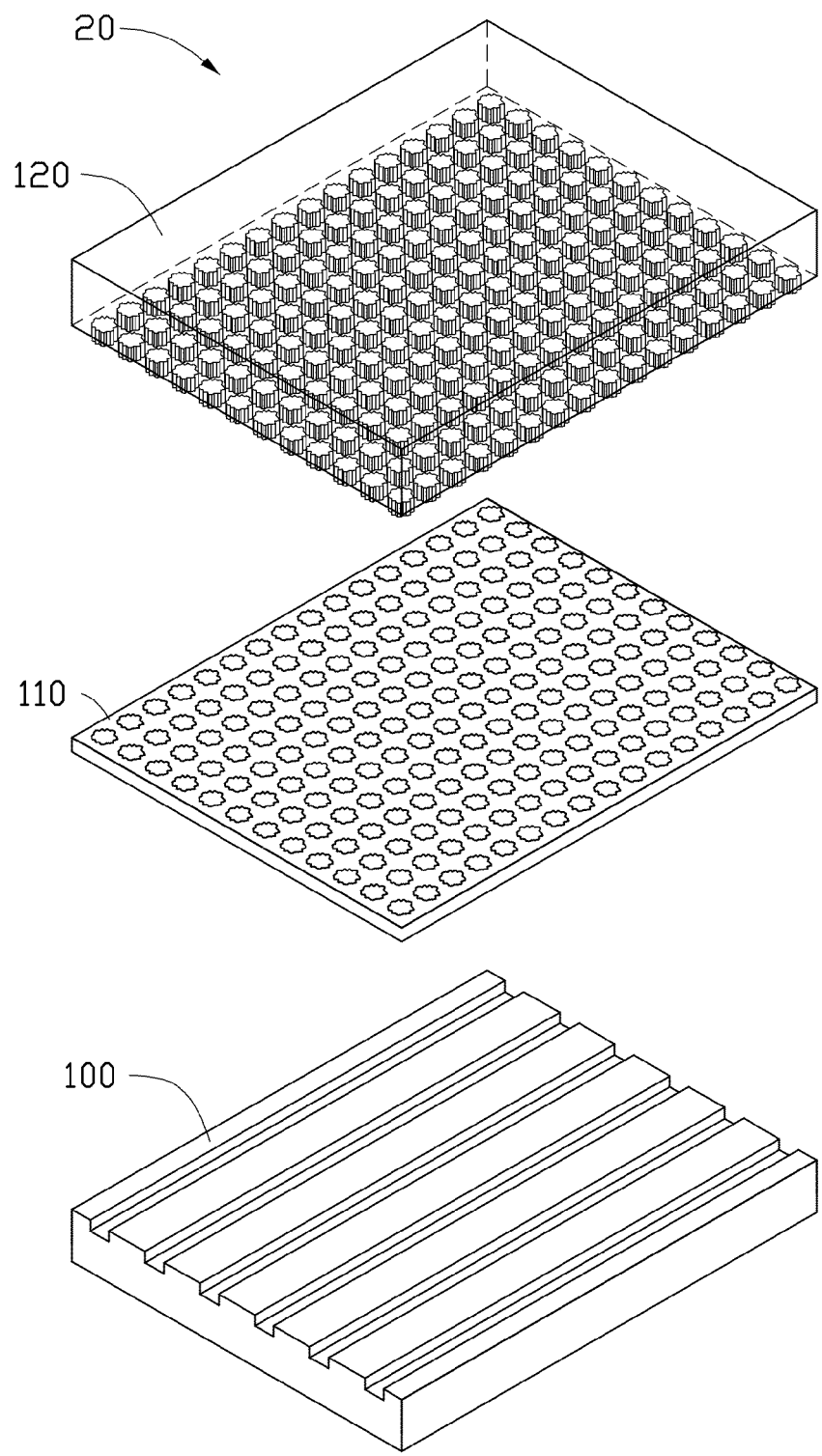
FIG. 15 is an exploded view of the epitaxial structure of FIG. 14.

Referring to FIGS. 14 and 15, an epitaxial structure 20 provided in one embodiment includes a substrate 100, a graphene layer 110, and an epitaxial layer 120. The epitaxial structure 20 is similar to the epitaxial structure 10 above except that the graphene layer 110 is a graphene film having a plurality of hole shaped apertures 112 arranged in a array. Part of the epitaxial layer 120 extends through the hole shaped apertures 112 and in contact with the substrate 100.

Figure 16:
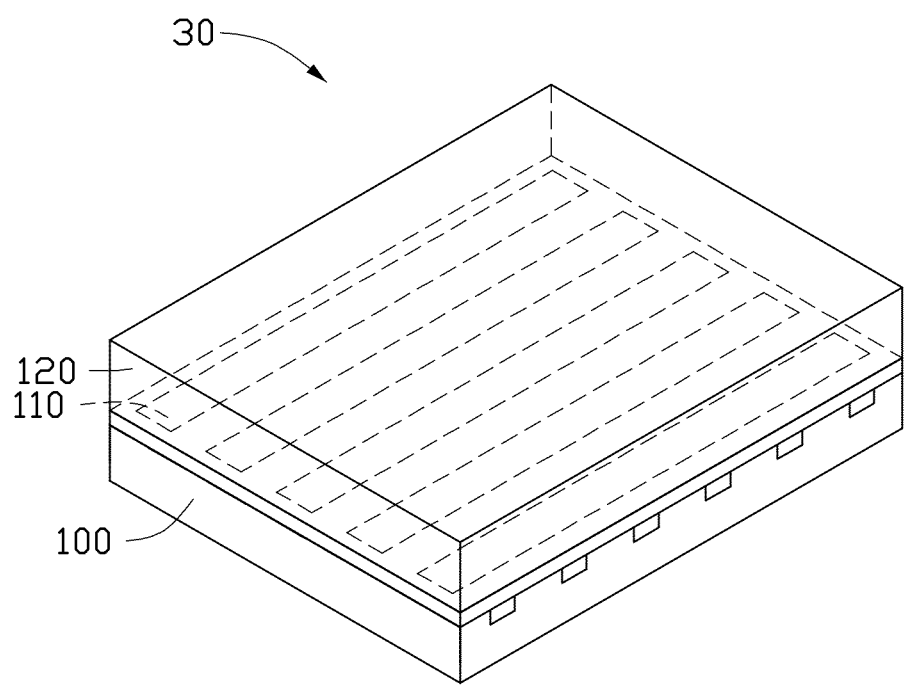
FIG. 16 is a schematic view of another embodiment of an epitaxial structure.

Referring to FIG. 16, an epitaxial structure 30 provided in one embodiment includes a substrate 100, a graphene layer 110, and an epitaxial layer 120. The epitaxial structure 30 is similar to the epitaxial structure 10 above except that the graphene layer 110 includes a plurality of graphene strips spaced from each other and arranged in a array. An aperture 112 is defined between two adjacent graphene strips. Part of the epitaxial layer 120 extends through the apertures 112 and in contact with the substrate 100.

Figure 17:
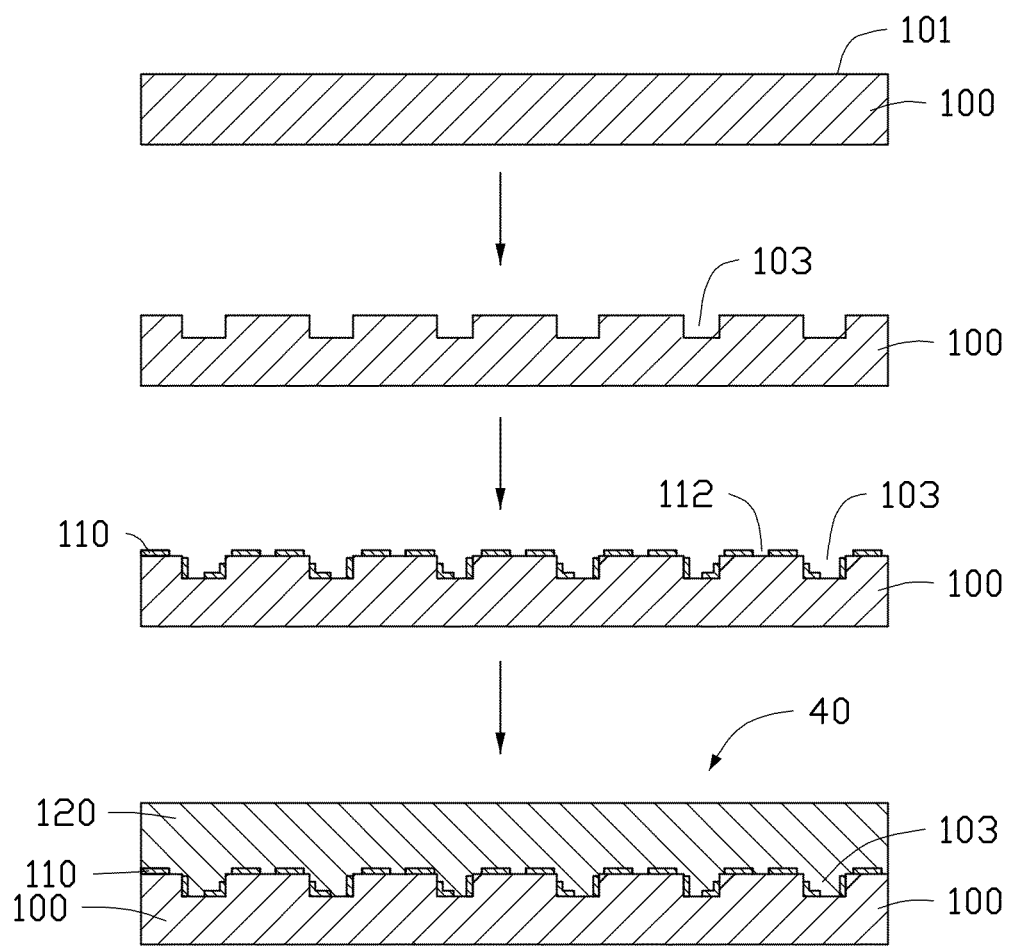
FIG. 17 is a flowchart of yet another embodiment of a method for making an epitaxial structure.

Referring to FIG. 17, one embodiment of a method for making an epitaxial structure 40 includes following steps:

(S21) providing a substrate 100 having an epitaxial growth surface 101;

(S22) forming a patterned epitaxial growth surface by etching the epitaxial growth surface 101 to form a plurality of grooves 103; and (S23) attaching a graphene layer 110 on the patterned epitaxial growth surface; and (S24) epitaxially growing an epitaxial layer 120 on the patterned epitaxial growth surface.

The method for making the epitaxial structure 40 is similar to the method for making the epitaxial structure 10, except that the graphene layer 110 in the method of making the epitaxial structure 40 is attached on the patterned epitaxial growth surface.

In step (S23), the graphene layer 110 is directly attached and in contact with the patterned epitaxial growth surface. The graphene layer 110 includes a first part directly attached on the patterned epitaxial growth surface between adjacent two of the grooves 103, and a second part directly attached on bottom surface and the sidewall of the plurality grooves 103.

In one embodiment, the graphene layer 110 includes a plurality of graphene strips spaced from each other, and each graphene strip is composed of graphene powders dispersed therein. The graphene powders include a plurality of dispersed graphene grains. When the graphene layer 110 includes graphene powders, the graphene powders can be formed into a patterned structure by the process of dispersion, coating and etching. An aperture 112 is defined between two adjacent graphene strips. In one embodiment, the graphene layer 110 of FIG. 17 can be made by following steps:

step (231), making a graphene suspension with graphene powder dispersed therein;

step (232), forming a continuous graphene coating on the epitaxial growth surface 101 of the substrate 100; and step (233), creating patterns on the continuous graphene coating.

In step (231), the powder is dispersed in a solvent such as water, ethanol, N-methylpyrrolidone, tetrahydrofuran, or 2-nitrogen dimethylacetamide. The graphene powder can be made by graphite oxide reduction, pyrolysis of sodium ethoxide, cutting carbon nanotube, carbon dioxide reduction method, or sonicating graphite. The concentration of the suspension can be in a range from about 1 mg/ml to about 3 mg/ml.

In step (232), the suspension can be coated on the pitaxial growth surface 101 of the substrate 100 by spinning coating. The rotating speed of spinning coating can be in a range from about 3000 r/min to about 5000 r/min. The time for spinning coating can be in a range from about 1 minute to about 2 minutes.

In step (233), the method of creating patterns on the continuous graphene coating can be photocatalytic titanium oxide cutting, ion beam etching, atomic force microscope etching, or the plasma etching.

In one embodiment, photocatalytic titanium oxide cutting is used to pattern the continuous graphene coating. The method includes following steps:

step (2331), making a patterned metal titanium layer;

step (2332), heating and oxidizing the patterned metal titanium layer to obtain a patterned titanium dioxide layer;

step (2333), contacting the patterned titanium dioxide layer with the continuous graphene coating;

step (2334), irradiating the patterned titanium dioxide layer with ultraviolet light; and step (2335), removing the patterned titanium dioxide layer.

In step (24), the graphene layer 110 is attached on the patterned epitaxial growth surface, and the epitaxial layer grains will grow on the patterned epitaxial growth surface through the apertures 112 and full fill into the plurality of grooves 103. The plurality of epitaxial crystal grains grows to a continuous epitaxial film and eventually grows to an epitaxial layer 120.

Figure 18:
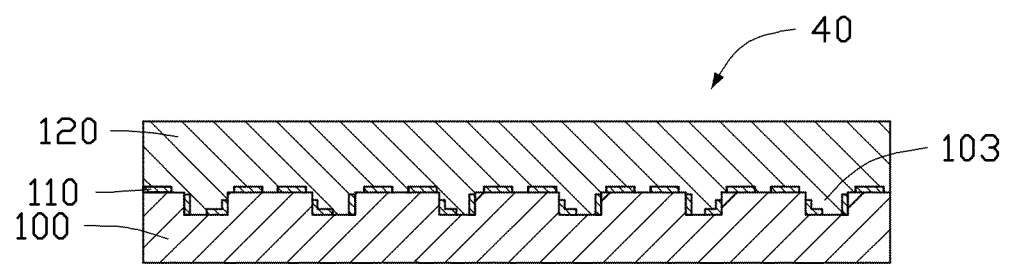
FIG. 18 is a schematic view of one embodiment of the epitaxial structure of FIG. 17.

Referring to FIG. 18, an epitaxial structure 40 provided in one embodiment includes a substrate 100, a graphene layer 110, and an epitaxial layer 120. The epitaxial structure 40 is similar to the epitaxial structure 10 above except that the graphene layer 110 includes a plurality of graphene strips spaced from each other, and a part of the graphene layer 110 is attached on the bottom surface and side of the plurality of grooves 103. The entire graphene layer 110 is directly attached on the patterned epitaxial growth surface.

Figure 19:
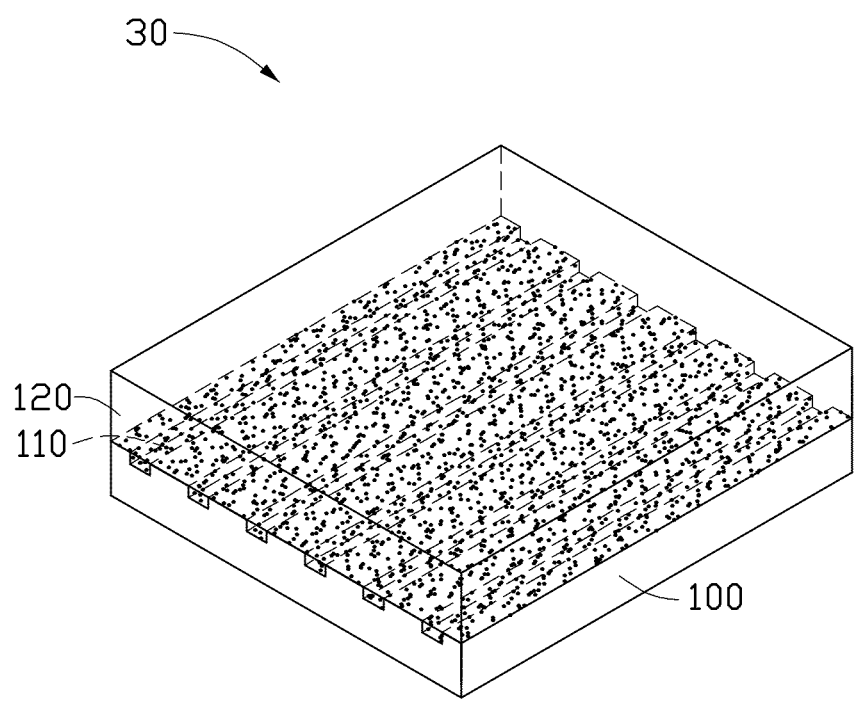
FIG. 19 is a schematic view of one embodiment of the epitaxial structure.

Referring to FIG. 19, an epitaxial structure 50 provided in one embodiment includes a substrate 100, a graphene layer 110, and an epitaxial layer 120. The epitaxial structure 50 is similar to the epitaxial structure 10 described above except that the graphene layer 110 includes a plurality of graphene powders dispersed on the patterned epitaxial growth surface of the substrate 100. The graphene powder can be directly grown on the substrate 100.

The epitaxial structure and method for growing the epitaxial layer on the epitaxial structure has following advantages. First, the substrate is a patterned structure having a plurality of grooves in micrometer scale, so the dislocation during the growth will be reduced. Second, the graphene layer is a patterned structure, the thickness and the aperture is in nanometer scale, thus the dislocation is further reduced and the quality of the epitaxial layer is improved. Third, due to the existence of the graphene layer, the contact surface between the epitaxial layer and the substrate will be reduced, and the stress between them is reduced, thus the substrate can be used to grow a relatively thicker epitaxial layer. Fourth, the graphene layer is a freestanding structure, thus it can be directly placed on the substrate, and the method is simple and low in cost. Fifth, the epitaxial layer grown on the substrate has relatively less dislocation, so it can be used to produce electronics in higher performance.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. An epitaxial structure comprising:
a substrate having a patterned epitaxial growth surface defining a plurality of grooves;
a graphene layer covering the patterned epitaxial growth surface, wherein the graphene layer defines a plurality of apertures to expose a part of the patterned epitaxial growth surface; and
an epitaxial layer on the patterned epitaxial growth surface, wherein the epitaxial layer is located on the graphene layer and contacting the substrate through the plurality of apertures, a first part of the graphene layer is sandwiched between the substrate and the epitaxial layer, and a second part of the graphene layer is embedded into the epitaxial layer.

2. The epitaxial structure of claim 1, wherein the graphene layer is a pure graphene structure consisting of graphene.

3. The epitaxial structure of claim 2, wherein the graphene layer comprises a graphene film consisting of a single layer of continuous carbon atoms.

4. The epitaxial structure of claim 3, wherein the graphene layer has a thickness same as a single carbon atom.

5. The epitaxial structure of claim 1, wherein a thickness of the graphene layer is in a range from about 1 nanometer to about 100 micrometers.

6. The epitaxial structure of claim 1, wherein sizes of the plurality of apertures are in a range from about 10 nanometers to about 10 micrometers, and a dutyfactor of the graphene layer is in a range from about 1:100 to about 100:1, wherein the dutyfactor is an area ratio between a covered part to the exposed part of the epitaxial growth surface.

7. The epitaxial structure of claim 1, wherein the plurality of grooves extends along a first direction, and the plurality of apertures extends along a second direction, the second direction intersects with the first direction.

8. The epitaxial structure of claim 7, wherein the first direction is perpendicular with the second direction.

9. The epitaxial structure of claim 1, wherein a width of each of the plurality of grooves ranges from about 1 μm to about 50 μm, a depth of each of the plurality of grooves ranges from about 0.1 μm to about 1 μm, and an interval between adjacent two of the plurality of grooves ranges from about 1 μm to about 20 μm.

10. The epitaxial structure of claim 1, wherein the graphene layer comprises a plurality of graphene strips spaced from each other, and an aperture is defined between adjacent two of the plurality of graphene strips.

11. The epitaxial structure of claim 1, wherein the first part of the graphene layer is attached on the patterned epitaxial growth surface, and the second part of the graphene layer overhangs each of the plurality of grooves.

12. The epitaxial structure of claim 1, wherein the epitaxial layer defines a plurality of holes, and the graphene layer is received into the plurality of holes.

13. The epitaxial structure of claim 1, wherein the material of the epitaxial layer is same as the material of the substrate.

14. The epitaxial structure of claim 1, wherein the epitaxial layer is coupled with the patterned epitaxial growth surface.

15. The epitaxial structure of claim 14, wherein the epitaxial layer is coupled with the patterned epitaxial growth surface by a plurality of bugles of the epitaxial layer engaged with the plurality of grooves of the substrate.

16. An epitaxial structure comprising:
   a substrate having a patterned epitaxial growth surface defining a plurality of grooves in microscale;
   a graphene layer entirely attached on the patterned epitaxial growth surface, wherein the graphene layer defines a plurality of apertures to expose a part of the patterned epitaxial growth surface; and
   an epitaxial layer on the patterned epitaxial growth surface, wherein the epitaxial layer is located on the graphene layer and contacting the substrate through the plurality of apertures, the graphene layer is sandwiched between the substrate and the epitaxial layer.

17. The epitaxial structure of claim 16, wherein the plurality of apertures extend through the graphene layer along a direction of a thickness of the graphene layer.

18. The epitaxial structure of claim 16, wherein the graphene layer is a graphene powder coating.

19. An epitaxial structure comprising:
   a substrate having a patterned epitaxial growth surface defining a plurality of grooves;
   an epitaxial layer on the patterned epitaxial growth surface; and
   a graphene layer entirely sandwiched between the substrate and the epitaxial layer, wherein the graphene layer defines a plurality of apertures, and the epitaxial layer is directly in contact with the patterned epitaxial growth surface through the plurality of apertures.

* * * * *